US012672587B2

(12) United States Patent
Chiu et al.

(10) Patent No.: US 12,672,587 B2
(45) Date of Patent: Jun. 30, 2026

(54) METHOD FOR FORMING CONDUCTIVE BUMPS BY PERFORMING A REFLOW PROCESS

(71) Applicant: Taiwan Semiconductor Manufacturing Company, Ltd., Hsinchu (TW)

(72) Inventors: Chao-Wei Chiu, Hsinchu City (TW); Wei-Yu Chen, Taipei City (TW); Chih-Chiang Tsao, Taoyuan City (TW); Hao-Jan Pei, Hsinchu (TW); Hsiu-Jen Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 496 days.

(21) Appl. No.: 18/182,369

(22) Filed: Mar. 13, 2023

(65) Prior Publication Data

US 2024/0312941 A1    Sep. 19, 2024

(51) Int. Cl.
*H10W 90/00* (2026.01)
*H10W 20/00* (2026.01)
(Continued)

(52) U.S. Cl.
CPC ....... *H10W 90/00* (2026.01); *H10W 20/0698* (2026.01); *H10W 74/01* (2026.01);
(Continued)

(58) Field of Classification Search
CPC ... H01L 21/76895; H01L 24/05; H01L 24/16; H01L 2224/051; H01L 2224/16135;
(Continued)

(56) References Cited

U.S. PATENT DOCUMENTS 6,933,221 B1 * 8/2005 Jiang ...................... H01L 24/29
257/E21.503
8,993,380 B2 3/2015 Hou et al.
(Continued)

FOREIGN PATENT DOCUMENTS

TW 200636958 10/2006
TW 201030915 8/2010
(Continued)

OTHER PUBLICATIONS

"Office Action of Taiwan Counterpart Application", issued on Jan. 10, 2024, p. 1-p. 6.

*Primary Examiner* — Khiem D Nguyen
(74) *Attorney, Agent, or Firm* — JCIPRNET

(57) ABSTRACT

An electronic apparatus including a package substrate and a structure disposed on and electrically connected to the package substrate through conductive bumps is provided. The material of the conductive bumps includes a bismuth (Bi) containing alloy or an indium (In) containing alloy. In some embodiments, the bismuth (Bi) containing alloy includes Sn—Ag—Cu—Bi alloy. In some embodiments, a concentration of bismuth (Bi) contained in the Sn—Ag—Cu—Bi alloy ranges from about 1 wt % to about 10 wt %. Methods for forming the Sn—Ag—Cu—Bi alloy are also provided.

20 Claims, 13 Drawing Sheets

(51) Int. Cl.

| | |
|---|---|
| *H10W 72/20* | (2026.01) |
| *H10W 74/01* | (2026.01) |
| *H10W 72/00* | (2026.01) |
| *H10W 72/90* | (2026.01) |

(52) U.S. Cl.
CPC .... *H10W 72/07255* (2026.01); *H10W 72/251* (2026.01); *H10W 72/923* (2026.01); *H10W 72/952* (2026.01); *H10W 90/721* (2026.01)

(58) Field of Classification Search
CPC ....... H01L 2225/1058; H01L 23/3128; H10W 74/01; H10W 90/00; H10W 20/0698; H10W 72/952; H10W 90/722
See application file for complete search history.

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,412,715 B2* | 8/2016 | Shimizu | H01L 23/49866 |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2011/0045653 A1 | 2/2011 | Ohno et al. | |
| 2015/0155258 A1* | 6/2015 | Chan | H01L 24/81 |
| | | | 438/126 |
| 2022/0216071 A1* | 7/2022 | Chen | H01L 21/4853 |

FOREIGN PATENT DOCUMENTS

| | | |
|---|---|---|
| TW | 201403773 | 1/2014 |
| TW | 201429328 | 7/2014 |

* cited by examiner

METHOD FOR FORMING CONDUCTIVE BUMPS BY PERFORMING A REFLOW PROCESS

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth as well as lower power consumption and latency has grown recently, there has grown a need for large-scaled and reliable electronic apparatus which utilizes advanced packaging techniques of semiconductor dies. For large-scaled electronic apparatus, warpage issue is a problem to be solved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
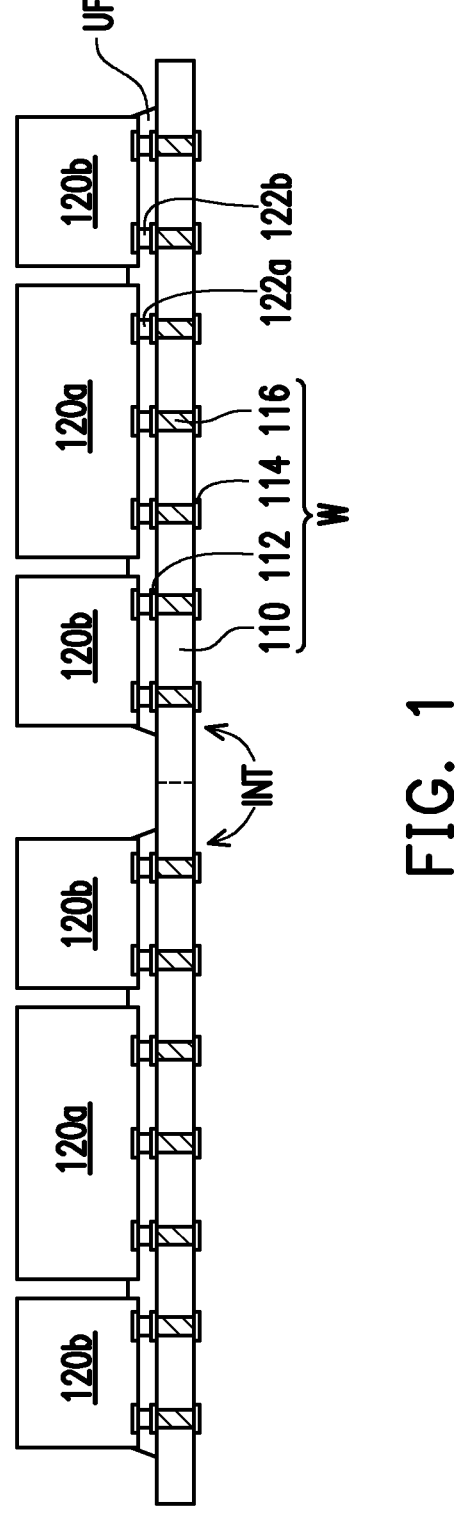
FIG. 1 through FIG. 8 are cross-sectional views schematically illustrating a process flow for fabricating an electronic apparatus structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 8 are cross-sectional views schematically illustrating a process flow for fabricating an electronic apparatus in accordance with some embodiments of the present disclosure.

Referring to FIG. 1, an interposer wafer W including interposers INT arranged in array is provided. The interposer wafer W may be a silicon interposer wafer including multiple silicon interposers or other suitable semiconductor interposer wafer. The interposer wafer W may include a semiconductor substrate 110, conductive pads 112 disposed on an upper surface of the semiconductor substrate 110, conductive pads 114 disposed on a lower surface of the semiconductor substrate 110, and through semiconductor vias (TSVs) 116 penetrating through the semiconductor substrate 110, wherein the TSVs 116 extend from the conductive pads 112 to the conductive pads 114, and the conductive pads 112 are electrically connected to the conductive pads 114 through the TSVs 116. Semiconductor dies 120a and semiconductor dies 120b are provided and mounted on a surface of the interposer wafer W on which the conductive pads 112 distributed such that the semiconductor dies 120a and semiconductor dies 120b are electrically connected to the interposers INT of the interposer wafer W. In some embodiments, the semiconductor dies 120a and semiconductor dies 120b are electrically connected to the conductive pads 112 of the interposer wafer W through conductive bumps 122a and conductive bumps 122b, respectively. The conductive bumps 122a are located between the semiconductor dies 120a and the conductive pads 112, and the conductive bumps 122b are located between the semiconductor dies 120b and the conductive pads 112. In some embodiments, the conductive bumps 122a are formed on the semiconductor dies 120a before the semiconductor dies 120a are mounted on the interposer wafer W, and the conductive bumps 122b are formed on the semiconductor dies 120b before the semiconductor dies 120b are mounted on the interposer wafer W. The conductive bumps 122a may be formed through a wafer-level bumping process performed on semiconductor wafers including the semiconductor dies 120a arranged in array, and the conductive bumps 122b may be formed through another wafer-level bumping process performed on semiconductor wafers including the semiconductor dies 120b arranged in array. In some embodiments, the semiconductor dies 120a includes logic dies, System-on-Chip (SoC) dies or other suitable semiconductor dies, and the semiconductor dies 120b includes High Bandwidth Memory (HBM) cubes each including stacked memory dies or other suitable semiconductor dies.

In some embodiments, the conductive bumps 122a and the conductive bumps 122b include micro bumps. The conductive bumps 122a and the conductive bumps 122b may each include a copper (Cu) pillar covered by a nickel (Ni) cap, and the nickel (Ni) cap may be electrically connected to the conductive pads 112 through solder material. For example, the solder material includes Sn—Ag solder material or other suitable solder material.

After the semiconductor dies 120a and the semiconductor dies 120b are mounted on and electrically connected to the interposer wafer W through the conductive bumps 122a and the conductive bumps 122b respectively, underfills UF1 may be formed over the interposer wafer W to fill the gaps between the semiconductor dies 120a and the interposer wafer W as well as gaps between the semiconductor dies 120b and the interposer wafer W. The conductive bumps 122a and the conductive bumps 122b are laterally encapsulated and well protected by the underfills UF1 such that damage of the conductive bumps 122a and the conductive bumps 122b resulted from Coefficient of Thermal Expansion (CTE) mismatch between the interposer wafer W and the semiconductor dies 120a and 120b may be minimized. Accordingly, reliability of the conductive bumps 122a and the conductive bumps 122b may be improved by the underfills UF1.

Figure 2:
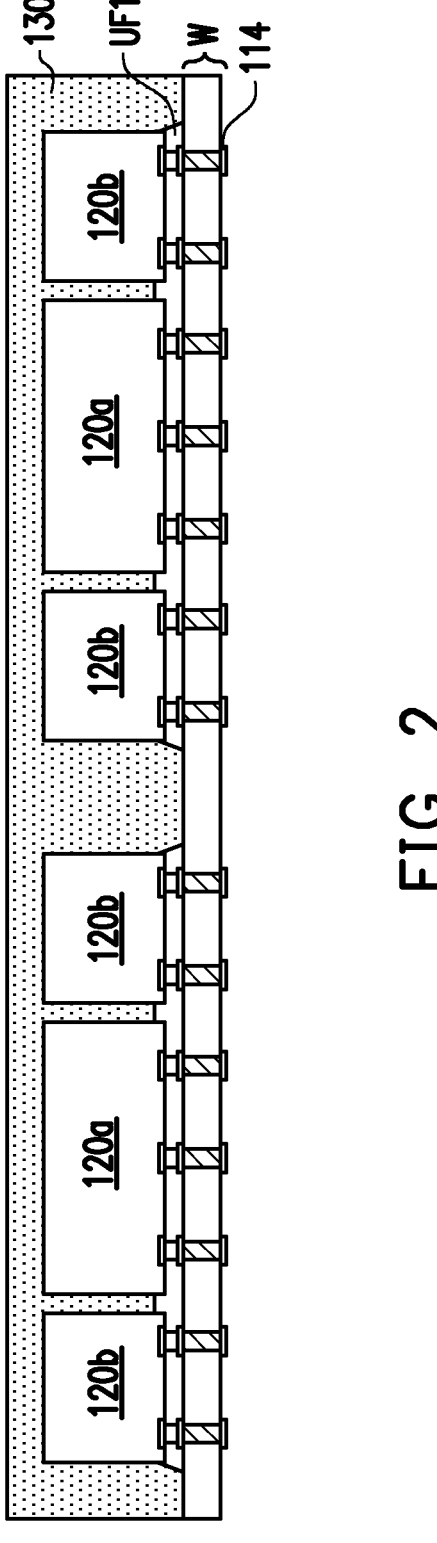
Figure 3:
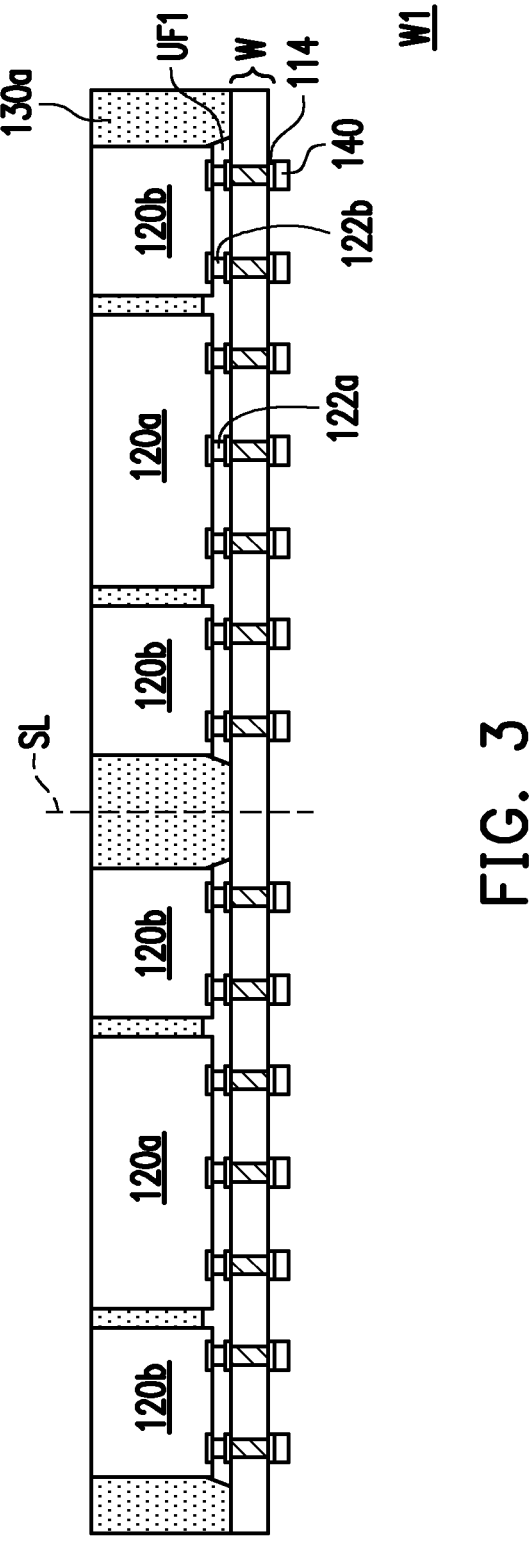

Referring to FIG. 2 and FIG. 3, an insulating material 130 is formed over the surface of the interposer wafer W on which the conductive pads 112 are distributed to cover the semiconductor dies 120a and the semiconductor dies 120b. The insulating material 130 may be formed by an over-molding process or a deposition process. The back surfaces of the semiconductor dies 120a and the semiconductor dies 120b may be covered by the insulating material 130, and the top surface of the insulating material 130 does not level with the back surfaces of the semiconductor dies 120a and the semiconductor dies 120b. In other words, the top surface of the insulating material 130 keeps a distance from the back surfaces of the semiconductor dies 120a and the semiconductor dies 120b. In some embodiments, as illustrated in FIG. 2, an insulating material 130 such as epoxy resin is formed on the interposer wafer W to cover the back surfaces and sidewalls of the semiconductor dies 120a and 120b through an over-molding process. In some alternative embodiments, an insulating material 130 such as tetraethoxysilane (TEOS) formed oxide is formed on the interposer wafer W to cover back surfaces and sidewalls of the semiconductor dies 120a and 120b through a chemical vapor deposition (CVD) process. As illustrated in FIG. 3, a removal process (e.g., a grinding process, a chemical mechanical polishing (CMP) process or other suitable removal process) is then performed to remove portions of the insulating material 130 until the back surfaces of the semiconductor dies 120a and 120b are revealed. After performing the above-mentioned removal process, as illustrated in FIG. 3, an insulating encapsulation 130a is formed to laterally encapsulate the semiconductor dies 120a and 120b, and the top surface of the insulating encapsulation 130a is substantially leveled with the back surfaces of the semiconductor dies 120a and 120b.

In some embodiments, during the removal process of the insulating material 130, the insulating material 130, the semiconductor dies 120a and the semiconductor dies 120b are partially removed such that the thickness of the semiconductor dies 120a and the semiconductor dies 120b is reduced.

A wafer-level bumping process may be performed such that conductive bumps 140 are formed on the conductive pads 114 of the interposer wafer W. In some embodiments, the wafer-level bumping process for forming the conductive bumps 140 is performed before formation of the insulating encapsulation 130a. In some alternative embodiments, the wafer-level bumping process for forming the conductive bumps 140 is performed after formation of the insulating encapsulation 130a.

After forming the insulating encapsulation 130a and the conductive bumps 140, a reconstructed wafer W1 is formed. The reconstructed wafer W1 may include the interposer wafer W, the semiconductor dies 120a, the semiconductor dies 120b, the conductive bumps 122a, the conductive bumps 122b, the underfills UF1, the insulating encapsulation 130a, and the conductive bumps 140.

Figure 4:
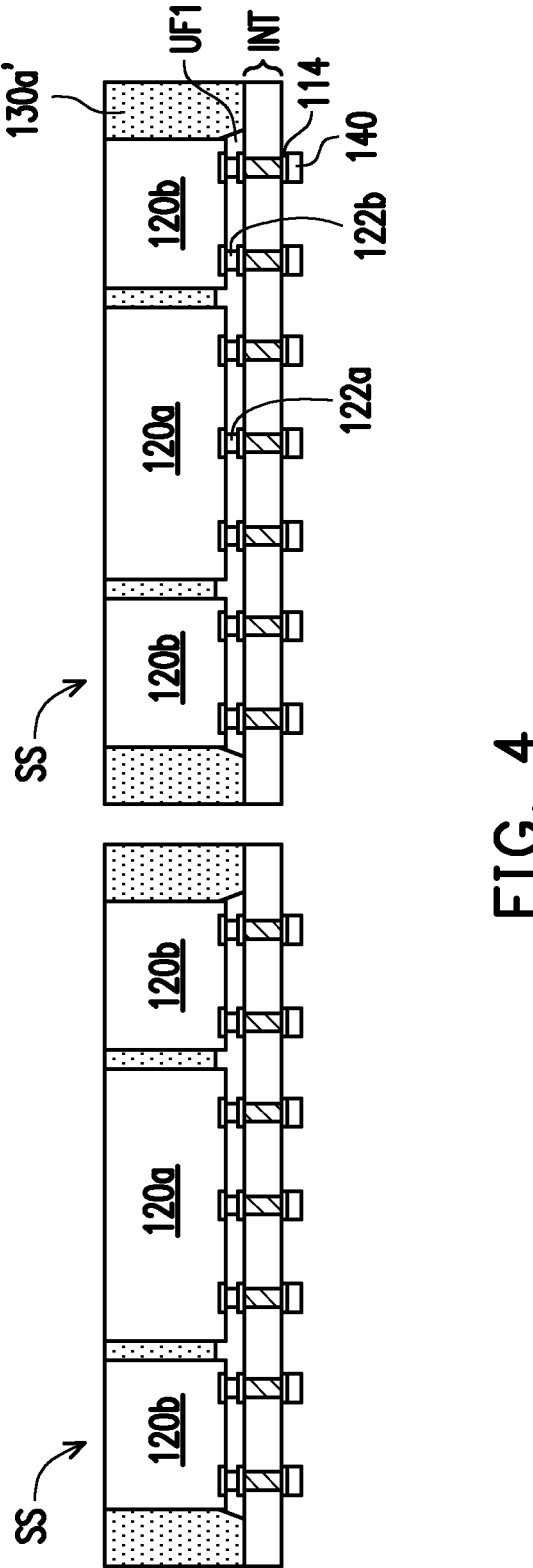

Referring to FIG. 3 and FIG. 4, a wafer saw process is then performed along scribe lines SL such that the reconstructed wafer W1 is singulated into multiple singulated structures SS. The singulated structures SS each may include an interposer substrate INT, at least one semiconductor die 120a, at least one semiconductor dies 120b, conductive bumps 122a, conductive bumps 122b, an underfill UF1, an insulating encapsulation 130a', and conductive bumps 140. The conductive bumps 122a are electrically connected and disposed between the semiconductor die 120a and the interposer substrate INT. The conductive bumps 122b are electrically connected between the semiconductor die 120b and the interposer substrate INT. The underfill UF1 laterally encapsulates the conductive bumps 122a and 122b. The underfill UF1 may further cover sidewalls of the semiconductor dies 120a and 120b. The insulating encapsulation 130a' laterally encapsulates the underfill UF1 as well as the semiconductor dies 120a and 120b, wherein sidewalls of the insulating encapsulation 130a' are substantially aligned with sidewalls of the interposer substrate INT. Furthermore, the conductive bumps 122a and 122b are disposed on a surface (e.g., an upper surface) of the interposer substrate INT, and the conductive bumps 140 are disposed on another surface (e.g., a lower surface) of the interposer substrate INT.

Figure 5:
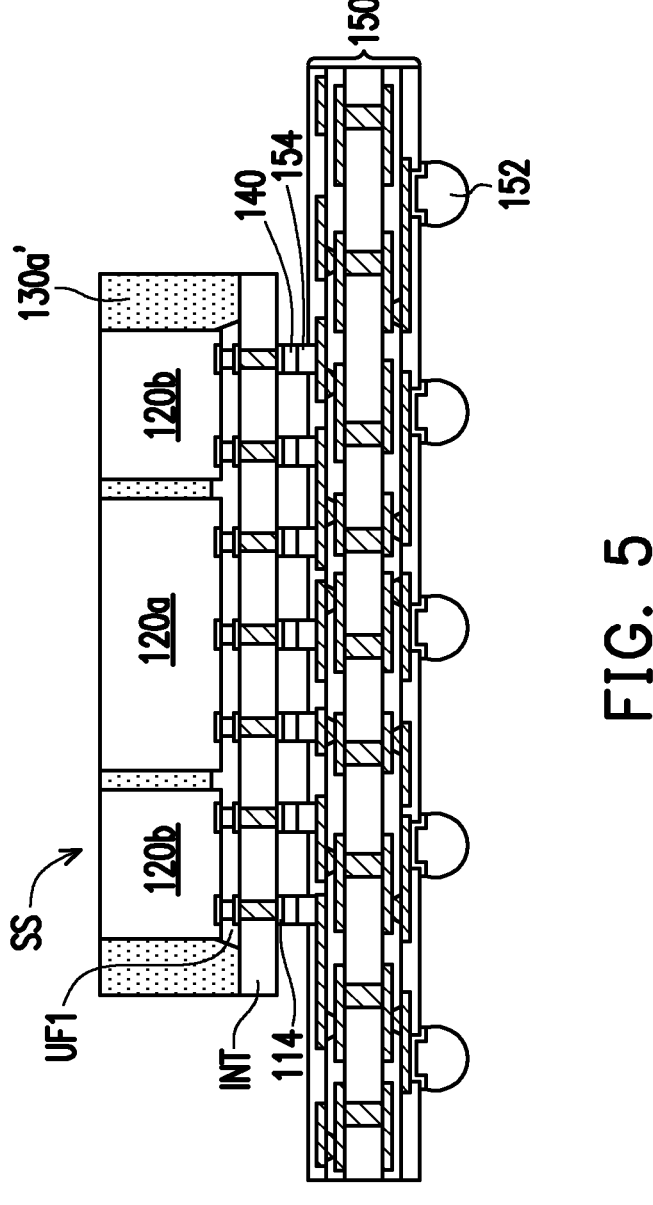

Referring to FIG. 5, a package substrate 150 is provided. The package substrate 150 may be or include an interposer (e.g., a silicon interposer, an organic interposer or other type of interposer) utilized a Chip-on-Wafer-on-Substrate (CoWoS) package. In some other embodiments, the package substrate 150 may be or include a wiring substrate utilized an integrated fan-out on substrate (InFO_oS) package structure, an integrated fan-out package structure having local silicon interconnect (InFO_LSI) or a flip-chip type ball grid array (F/C BGA) package structure. The package substrate 150 may have a bottom surface and a top surface opposite to the bottom surface. The package substrate 150 may include conductive terminals 152 formed on the bottom surface of the package substrate 150, and the package substrate 150 may further include alloy patterns 154 formed on the top surface of the package substrate 150. In some embodiments, the package substrate 150 includes a dielectric core layer, build-up or laminated dielectric layers stacked over opposite surfaces of the dielectric core layer, conductive wiring layers embedded in the build-up or laminated dielectric layers, conductive vias penetrating through the dielectric core layer and the build-up or laminated dielectric layers. The conductive terminals 152 are formed on the bottom surface of the package substrate 150 and electrically connected to the bottommost conductive wiring layer of the package substrate 150. The alloy patterns 154 are formed on the top surface of the package substrate 150 and electrically connected to conductive pads 151 of the package substrate 150. In some embodiments, the material of the alloy patterns 154 includes pre-solder material.

Figure 6:
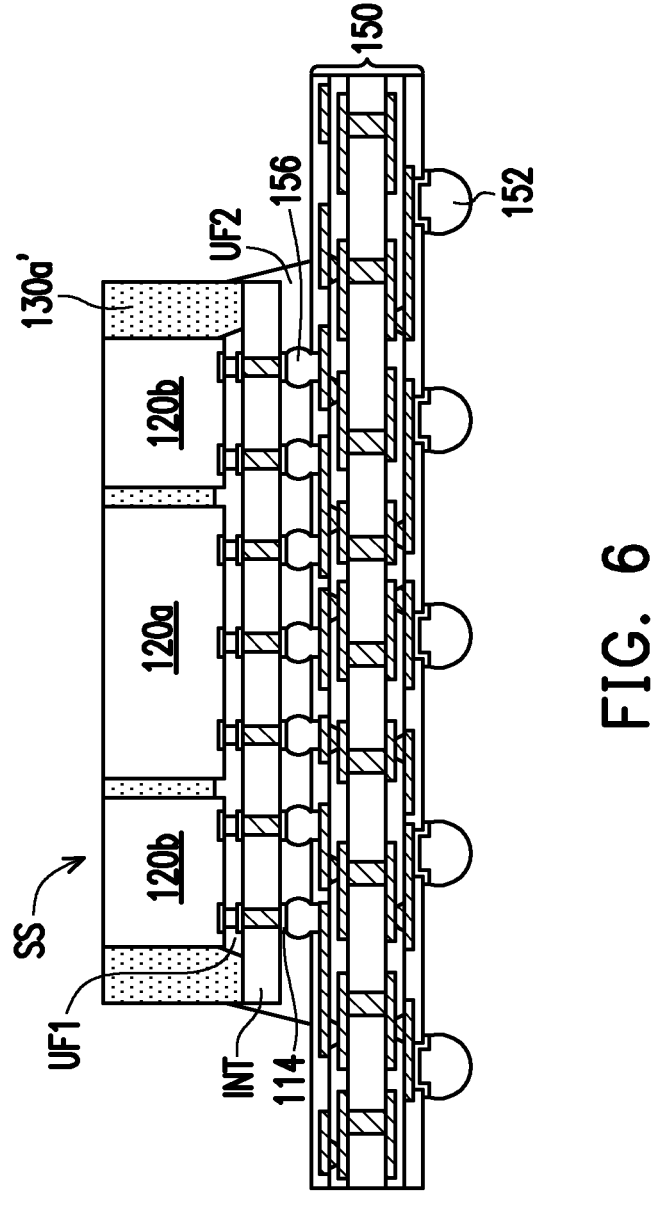

Referring to FIG. 5 and FIG. 6, at least one of the singulated structures SS (illustrated in FIG. 4) singulated from the reconstructed wafer W1 illustrated in FIG. 3 is picked-up and placed on the top surface of the package substrate 150. After the singulated structures SS illustrated in FIG. 4 is picked-up and placed on the top surface of the package substrate 150, the conductive bumps 140 of the singulated structure SS is physically in contact with the alloy patterns 154 (e.g., pre-solder material) formed on the package substrate 150. A pre-heating process is performed to pre-bond the conductive bumps 140 of the singulated structure SS and the alloy patterns 154 formed on the package substrate 150. The pre-heating process may be performed under a lower process temperature ranging from about 150 degrees Celsius to about 180 degrees Celsius. During the pre-heating process, the conductive bumps 140 may be pressed onto the alloy patterns 154 such that a pre-bonding interface is generated between the conductive bumps 140 and the alloy patterns 154. During the pre-heating process, the conductive bumps 140 and the alloy patterns 154 in contact with the conductive bumps 140 are heated, the heated conductive bumps 140 and the heated alloy patterns 154 remain solid state, and less deformation occurs between the singulated structure SS and the package substrate 150. After performing the pre-heating process, a reflow process is then performed to heat the conductive bumps 140 and the alloy patterns 154. The reflow process may be performed under a higher process temperature ranging from about 230 degrees Celsius to about 250 degrees Celsius. After performing the reflow process, mutual fusion of the conductive bumps 140 and the alloy patterns 154 forms the conductive bumps 156 between the conductive pads 114 and the conductive pads 151. After performing the reflow process, the singulated structure SS is electrically connected to the package substrate 150 through the conductive bumps 156.

In some embodiments, the material of the conductive bumps 156 includes a bismuth (Bi) containing alloy. The bismuth (Bi) containing alloy may be Sn—Ag—Cu—Bi alloy. For example, the concentration of bismuth (Bi) contained in the Sn—Ag—Cu—Bi alloy ranges from about 1 wt % to about 10 wt %. The concentration of bismuth (Bi) contained in the Sn—Ag—Cu—Bi alloy may be less than about 6 wt %.

In some other embodiments, the material of the conductive bumps 156 includes an indium (In) containing alloy. The indium (In) containing alloy may be Sn—Ag—Cu—In alloy. For example, the concentration of indium (In) contained in the Sn—Ag—Cu—In alloy ranges from about 1 wt % to about 10 wt %. The concentration of indium (In) contained in the Sn—Ag—Cu—In alloy may be less than about 6 wt %.

After performing the thermal treatment including the above-mentioned pre-heating and reflow processes, the warpage issue generated between the singulated structure SS and the package substrate 150 may be mitigated because of modification of the material of the conductive bumps 140 and the alloy patterns 154. In other words, since the material of the conductive bumps 156 includes a bismuth (Bi) containing alloy or an indium (In) containing alloy, the warpage issue generated between the singulated structure SS and the package substrate 150 may be mitigated.

The details of the pre-heating process and the reflow process are described in accompany with FIG. 9 through FIG. 12.

After the at least one singulated structure SS is mounted on and electrically connected to the package substrate 150, an underfill UF2 may be formed to fill a gap between the package substrate 150 and the interposer substrate INT of the singulated structure SS. The conductive bumps 156 are laterally encapsulated and well protected by the underfill UF2 such that damage of the conductive bumps 156 resulted from CTE mismatch between the interposer substrate INT and the package substrate 150 may be minimized. Accordingly, reliability of the conductive bumps 156 may be improved.

In some embodiments, the underfill UF2 not only fills the gap between the package substrate 150 and the interposer substrate INT of the singulated structure SS, but also covers sidewalls of the singulated structure SS. As illustrated in FIG. 6, the underfill UF2 not only fills the gap between the package substrate 150 and the interposer substrate INT of the singulated structure SS, but also covers sidewalls of the interposer substrate INT and sidewalls of the insulating encapsulation 130a'.

Figure 7:
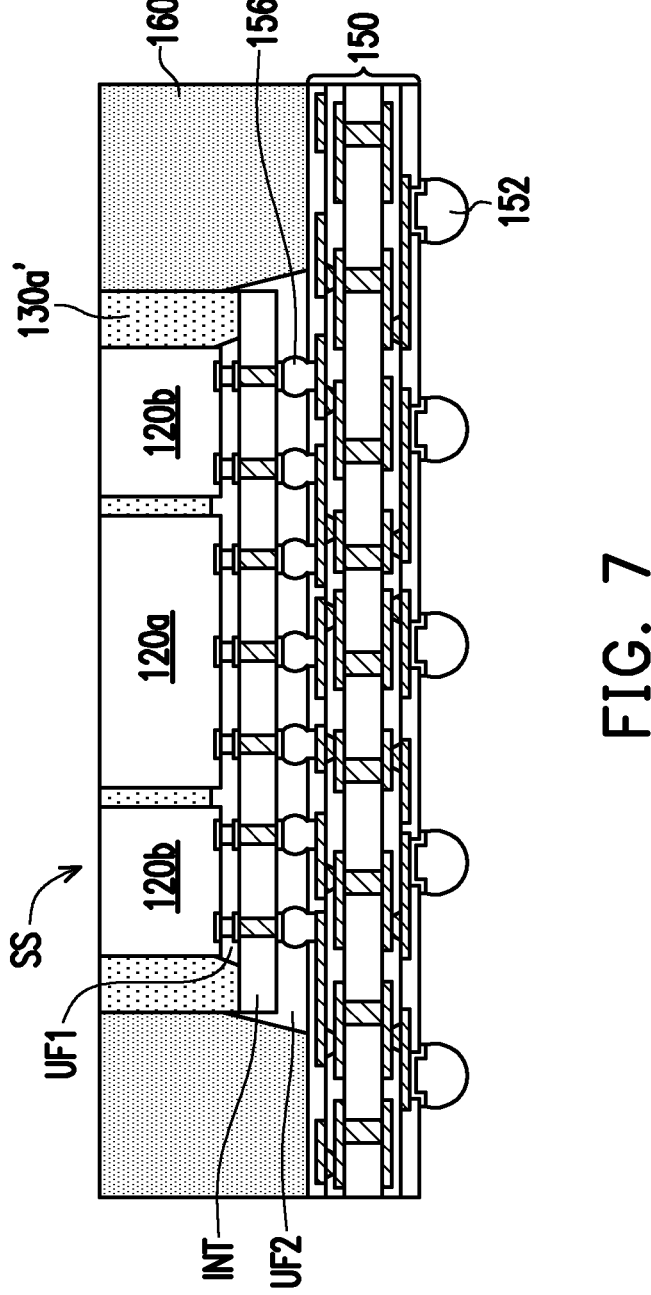

Referring to FIG. 7, an insulating material is formed over the package substrate 150 to cover the underfill UF2 and the singulated structure SS mounted on the package substrate 150. The insulating material may be formed by an over-molding process or a deposition process followed by a removal process. In some embodiments, an insulating material such as epoxy resin is formed on the package substrate 150 to cover the back surfaces and sidewalls of the singulated structure SS through an over-molding process, and a grinding process, a chemical mechanical polishing (CMP) process or other suitable removal process is then performed to remove portions of the insulating material (e.g., epoxy resin) until the top surface of the insulating encapsulation 130a' as well as the back surfaces of the semiconductor dies 120a and 120b in the singulated structure SS are revealed. In some alternative embodiments, an insulating material such as tetraethoxysilane (TEOS) formed oxide is formed on the interposer wafer W to cover back surfaces and sidewalls of the singulated structure SS through a chemical vapor deposition (CVD) process, and a grinding process, a CMP process or other suitable removal process is then performed to remove portions of the TEOS formed oxide until the top surface of the insulating encapsulation 130a' as well as the back surfaces of the semiconductor dies 120a and 120b in the singulated structure SS are revealed. After performing the above-mentioned removal process, an insulating encapsulation 160 is formed, and the top surface of the insulating encapsulation 160 substantially levels with the back surfaces of the semiconductor dies 120a and 120b in the singulated structure SS.

Furthermore, as illustrated in FIG. 7, the top surface of the insulating encapsulation 160 is substantially leveled with the top surface of the insulating encapsulation 130a' and the top surfaces of the semiconductor dies 120a and 120b, and sidewalls of the insulating encapsulation 160 are substantially aligned with sidewalls of the package substrate 150. In some alternative embodiments, not illustrated in figures, the top surface of the insulating encapsulation 160 substantially levels with the top surface of the insulating encapsulation 130a' and the top surfaces of the semiconductor dies 120a and 120b, and sidewalls of the insulating encapsulation 160 keep a lateral distance from sidewalls of the package substrate 150.

Figure 8:
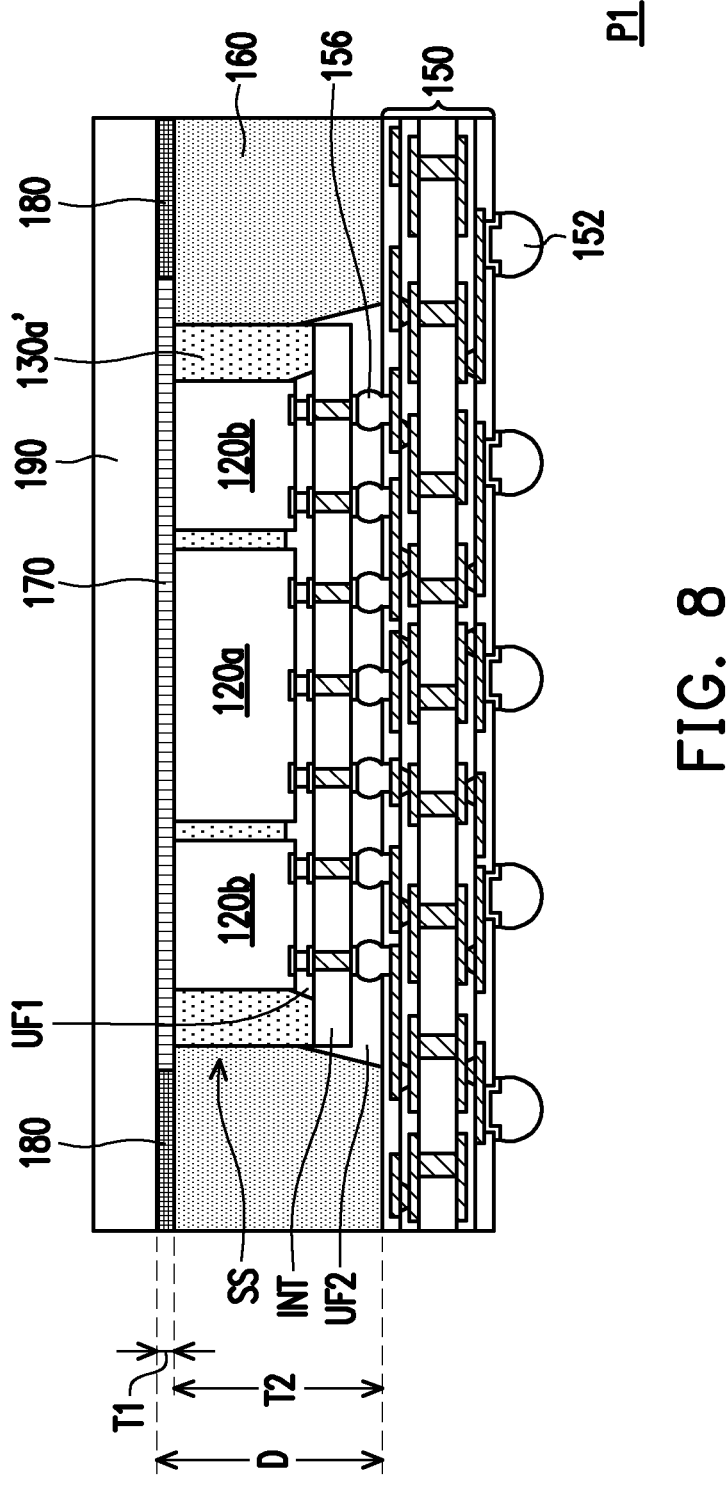

Referring to FIG. 8, after forming the insulating encapsulation 160, a thermal interface material (TIM) 170 and an adhesive 180 are applied to cover the singulated structure SS and the insulating encapsulation 160. The thermal interface material 170 may cover the top surface of the singulated structure SS and a portion of the top surface of the insulating encapsulation 160, and the adhesive 180 may cover the rest portion of the top surface of the insulating encapsulation 160. The material of the thermal interface material 170 may include metallic TIM, such as indium (In) sheet or film, indium foil, indium solder, silver (Ag) paste, silver alloy or combination thereof. The thermal interface material 170 may also be polymer-based TIM with thermal conductive fillers. Applicable thermal conductive filler materials may include aluminum oxide, boron nitride, aluminum nitride, aluminum, copper, silver, indium, a combination thereof, or the like. The thermal interface material 170 may include film-based or sheet-based material such as sheet with synthesized carbon nano-tube (CNT) structure integrated into the sheet, thermal conductive sheet with vertically oriented graphite fillers or the like, and the material of the adhesive 180 may include thermally conductive adhesive or epoxy-based adhesive or the like. A cover lid 190 is then provided over and attached to the thermal interface material 170 and the adhesive 180. The cover lid 190 is thermally coupled to the back surfaces of the semiconductor dies 120a and 120b in the singulated structure SS through the thermal interface material 170, and the cover lid 190 is adhered with the top surface of the insulating encapsulation 160 through the adhesive 180. The material of the cover lid 190 may include copper, aluminum, cobalt, copper coated with nickel, stainless steel, tungsten, silver diamond, aluminum silicon carbide or the like. Furthermore, the cover lid 190 may serve and function as a heat sink.

In some alternative embodiments, not illustrated in figures, the top surface of the singulated structure SS and the top surface of the insulating encapsulation 160 are covered by the thermal interface material 170, and formation of the adhesive 180 is omitted. In other words, the cover lid 190 is attached to the singulated structure SS and the insulating encapsulation 160 through the thermal interface material 170.

As illustrated in FIG. 8, after forming the cover lid 190, a Chip-on-Wafer-on-Substrate (CoWoS) package structure P1 is formed. The CoWoS package structure P1 includes a package substrate 150, an interposer substrate INT disposed on and electrically connected to the package substrate 150, semiconductor dies 120a and 120b disposed on and electrically connected to the interposer substrate INT, a first insulating encapsulation 130a' disposed on the interposer substrate INT, a second insulating encapsulation 160 disposed on the package substrate 150, and a cover lid 190 is provided. The semiconductor dies 120a and 120b are laterally encapsulated by the first insulating encapsulation 130a'.

The semiconductor dies 120a and 120b and the first insulating encapsulation 130a' are laterally encapsulated by the second insulating encapsulation 160. Sidewalls of the cover lid 190 are substantially aligned with sidewalls of the second insulating encapsulation 160 and sidewalls of the package substrate 150. The cover lid 190 is disposed on the semiconductor dies 120a and 120b, the first insulating encapsulation 130a' and the second insulating encapsulation 160. In some embodiments, the CoWoS package structure P1 further includes an adhesive 180 and a thermal interface material 170, wherein the adhesive is disposed between the second insulating encapsulation 160 and the cover lid 190, and the thermal interface material 170 is disposed between the semiconductor dies 120a and 120b and the cover lid 190. In some embodiments, a first top surface of the first insulating encapsulation 130a' is substantially leveled with a second top surface of the second insulating encapsulation 160. In some embodiments, the CoWoS package structure P1 further includes an underfill UF2 disposed between the interposer substrate INT and the package substrate 150, wherein the underfill UF2 is laterally encapsulated by the second insulating encapsulation 160.

As illustrated in FIG. 8, the cover lid 190 may be a metallic plate with favorable thermal conductivity and structural strength. The minimum distance D between the cover lid 190 and the package substrate 150 is greater than the maximum thickness T1 of the second insulating encapsulation 160. In some embodiments, the minimum distance D between the cover lid 190 and the package substrate 150 substantially equals to a sum of the maximum thickness T1 of the second insulating encapsulation 160 and the thickness T2 of the thermal interface material 170. The minimum distance D between the cover lid 190 and the package substrate 150 may range from about 800 micrometers to about 1200 micrometers, the maximum thickness T2 of the second insulating encapsulation 160 may range from about 600 micrometers to about 900 micrometers, and the thickness T1 of the thermal interface material 170 may range from about 50 micrometers to about 300 micrometers.

Figures 9, 10:
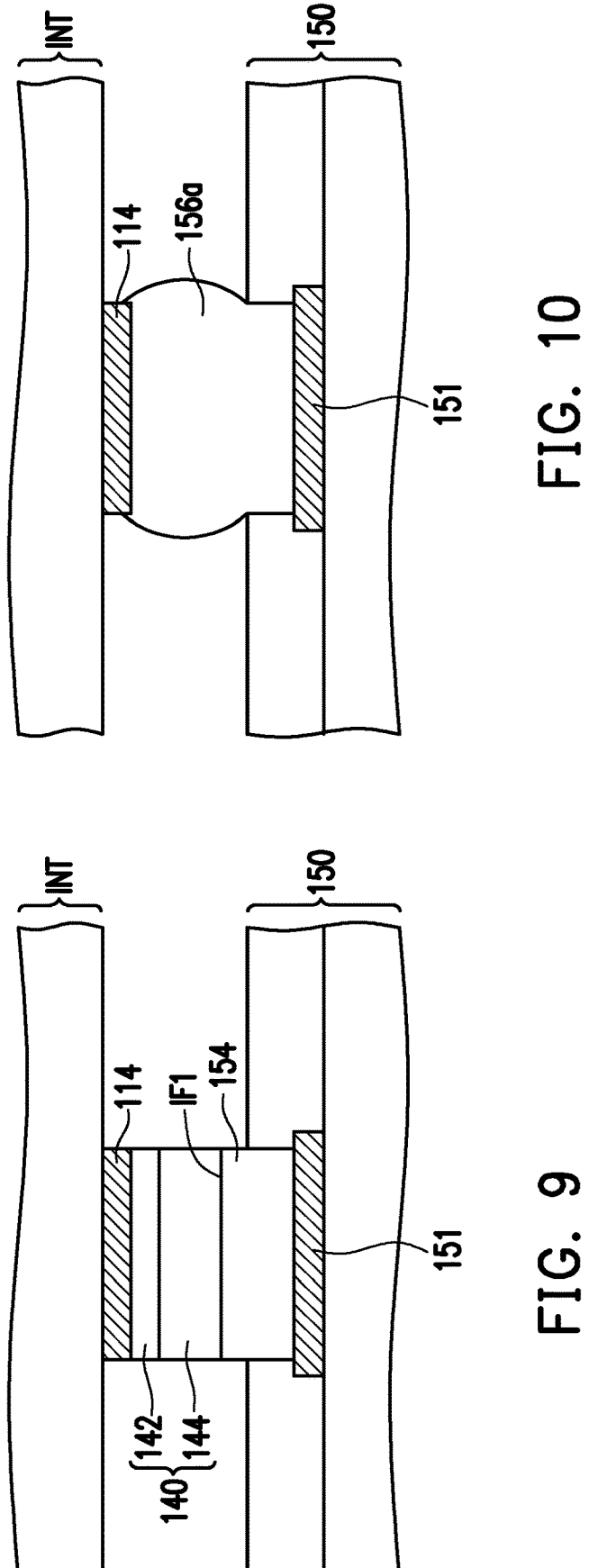
FIG. 9 is a cross-sectional view schematically illustrating the conductive bump 140 and the alloy pattern 154 after performing a pre-heating process in accordance with some embodiments of the present disclosure.
FIG. 10 is a cross-sectional view schematically illustrating the conductive bump 156a after performing a reflow process in accordance with some embodiments of the present disclosure.

FIG. 9 is a cross-sectional view schematically illustrating the conductive bump 140 and the alloy pattern 154 after performing a pre-heating process in accordance with some embodiments of the present disclosure.

Referring to FIG. 9, the conductive bump 140 is formed on the conductive pad 114 distributed on the bottom surface of the interposer substrate INT, the bottom surface of the interposer substrate INT faces the package substrate 150, and the width of the conductive bump 140 may be substantially equal to the width of the conductive pad 114. The conductive bump 140 includes stacked alloy patterns. In the present embodiment, the stacked alloy patterns of the conductive bump 140 includes an alloy pattern comprising Sn and Ag 142 and a Sn—Bi alloy pattern 144 covering the alloy pattern comprising Sn and Ag 142, wherein the alloy pattern comprising Sn and Ag 142 is disposed on and physically in contact with the conductive pads 114, and the Sn—Bi alloy pattern 144 is disposed on and physically in contact with the alloy pattern comprising Sn and Ag 142. That is, the alloy pattern comprising Sn and Ag 142 is disposed between the Sn—Bi alloy pattern 144 and the conductive pad 114. The conductive pad 114 may include copper (Cu) pad, and the thickness of the conductive pad 114 may range from about 5 micrometers to about 15 micrometers. The concentration of silver (Ag) contained in the alloy pattern comprising Sn and Ag 142 may range from about 1.0 wt % to about 2.5 wt %, and the thickness of the alloy pattern comprising Sn and Ag 142 may range from about 20 micrometers to about 25 micrometers. The concentration of bismuth (Bi) contained in the Sn—Bi alloy pattern 144 may range from about 40 wt % to about 58 wt %, and the thickness of the Sn—Bi alloy pattern 144 may range from about 10 micrometers to about 15 micrometers. The overall thickness of the bump 140 may range from about 30 micrometers to about 40 micrometers. Furthermore, the conductive pad 114, the alloy pattern comprising Sn and Ag 142 and the Sn—Bi alloy pattern 144 are substantially identical in width.

The alloy pattern 154 is disposed on and physically in contact with the conductive pad 151 of the package substrate 150. The alloy pattern 154 (e.g., pre-solder material) may include a Sn—Cu alloy pattern. The concentration of copper (Cu) contained in the alloy pattern comprising Sn and Cu 154 may range from about 0.4 wt % to about 1.1 wt %, and the thickness of the alloy pattern comprising Sn and Cu 154 may range from about 35 micrometers to about 45 micrometers.

During the pre-heating process, the conductive bump 140 formed on the conductive pads 114 of the interposer substrate INT is vertically aligned with the alloy pattern comprising Sn and Cu 154 formed on the conductive pads 151 of the package substrate 150. During the pre-heating process, the Sn—Bi alloy pattern 144 is pressed onto the top surface of the alloy pattern comprising Sn and Cu 154. That is, the Sn—Bi alloy pattern 144 is physically in contact with the alloy pattern comprising Sn and Cu 154. Then, a low temperature thermal treatment is performed to pre-heat the alloy pattern comprising Sn and Ag 142, the Sn—Bi alloy pattern 144 and the alloy pattern comprising Sn and Cu 154 such that the Sn—Bi alloy pattern 144 and the alloy pattern comprising Sn and Cu 154 are pre-bonded through a pre-bonding interface IF1 generated between the Sn—Bi alloy pattern 144 and the alloy pattern comprising Sn and Cu 154. The process temperature of the low temperature thermal treatment may range from about 150 degrees Celsius to about 180 degrees Celsius. The pre-bonding interface IF1 may be an intermetallic compound (IMC) layer containing Sn, Cu and Bi. When performing the low temperature thermal treatment, the conductive bump 140 and the alloy pattern 154 in contact with the conductive bump 140 are heated, the heated conductive bump 140 and the heated alloy pattern 154 remain solid state, and less deformation occurs between the interposer substrate INT and the package substrate 150.

In some alternative embodiments, the stacked alloy patterns of the conductive bump 140 includes an alloy pattern comprising Sn and Ag 142 and a Sn—In alloy pattern 144 covering the alloy pattern comprising Sn and Ag 142, wherein the alloy pattern comprising Sn and Ag 142 is disposed on and physically in contact with the conductive pads 114, and the Sn—In alloy pattern 144 is disposed on and physically in contact with the alloy pattern comprising Sn and Ag 142. That is, the alloy pattern comprising Sn and Ag 142 is disposed between the Sn—In alloy pattern 144 and the conductive pad 114. The conductive pad 114 may include copper (Cu) pad, and the thickness of the conductive pad 114 may range from about 5 micrometers to about 15 micrometers. The concentration of silver (Ag) contained in the alloy pattern comprising Sn and Ag 142 may range from about 1.0 wt % to about 2.5 wt %, and the thickness of the alloy pattern comprising Sn and Ag 142 may range from about 20 micrometers to about 25 micrometers. The concentration of indium (In) contained in the Sn—In alloy pattern 144 may range from about 15 wt % to about 25 wt %, and the thickness of the Sn—In alloy pattern 144 may range from about 10 micrometers to about 15 micrometers. The overall thickness of the bump 140 may range from about 30 micrometers to about 40 micrometers. Furthermore, the conductive pad 114, the alloy pattern comprising Sn and Ag 142 and the Sn—In alloy pattern 144 are substantially identical in width.

In some embodiments, the alloy pattern comprising Sn and Ag 142, the Sn—Bi or Sn—In alloy pattern 144, and the alloy pattern comprising Sn and Cu 154 are solid state during the pre-heating process.

FIG. 10 is a cross-sectional view schematically illustrating the conductive bump 156a after performing a reflow process in accordance with some embodiments of the present disclosure.

Referring to FIG. 10, after performing the pre-heating process, a high temperature thermal treatment (i.e., a reflow process) is performed to heat the alloy pattern comprising Sn and Ag 142, the Sn—Bi alloy pattern 144 and the alloy pattern 154. The high temperature thermal treatment (i.e., a reflow process) may be performed under a higher process temperature ranging from about 230 degrees Celsius to about 250 degrees Celsius. After performing the above-mentioned reflow process, mutual fusion of the conductive bump 140 and the alloy pattern 154 forms the conductive bump 156a between the conductive pad 114 and the conductive pad 151. After performing the reflow process, the interposer substrate INT is electrically connected to the package substrate 150 through the conductive bumps 156a. In some embodiments where the stacked alloy patterns of the conductive bump 140 includes the alloy pattern comprising Sn and Ag 142 and the Sn—Bi alloy pattern 144, the material of the conductive bump 156a includes a bismuth (Bi) containing alloy containing alloy. The bismuth (Bi) containing alloy may be Sn—Ag—Cu—Bi alloy. For example, the concentration of bismuth (Bi) contained in the Sn—Ag—Cu—Bi alloy ranges from about 1 wt % to about 10 wt %. In some embodiments, the concentration of bismuth (Bi) contained in the Sn—Ag—Cu—Bi alloy is less than about 6 wt %.

In some alternative embodiments where the stacked alloy patterns of the conductive bump 140 includes the alloy pattern comprising Sn and Ag 142 and the Sn—In alloy pattern 144, the material of the conductive bumps 156a includes an indium (In) containing alloy. The indium (In) containing alloy may be Sn—Ag—Cu—In alloy. For example, the concentration of indium (In) contained in the Sn—Ag—Cu—In alloy ranges from about 1 wt % to about 10 wt %. The concentration of indium (In) contained in the Sn—Ag—Cu—In alloy may be less than about 6 wt %.

In some embodiments, the alloy pattern comprising Sn and Cu 154 is liquid state, the Sn—Bi or Si—In alloy pattern 144 is solid state, and the alloy pattern comprising Sn and Ag 142 is solid state when performing the reflow process. In some other embodiments, the alloy patterns comprising Sn and Cu 154, the Sn—Bi or Si—In alloy pattern 144, and the alloy pattern comprising Sn and Ag 142 are solid state when performing the reflow process. In some alternative embodiments, the alloy pattern comprising Sn and Cu 154, the Sn—Bi or Si—In alloy pattern 144, and the alloy patterns comprising Sn and Ag 142 are liquid state when performing the reflow process.

Figures 11, 12:
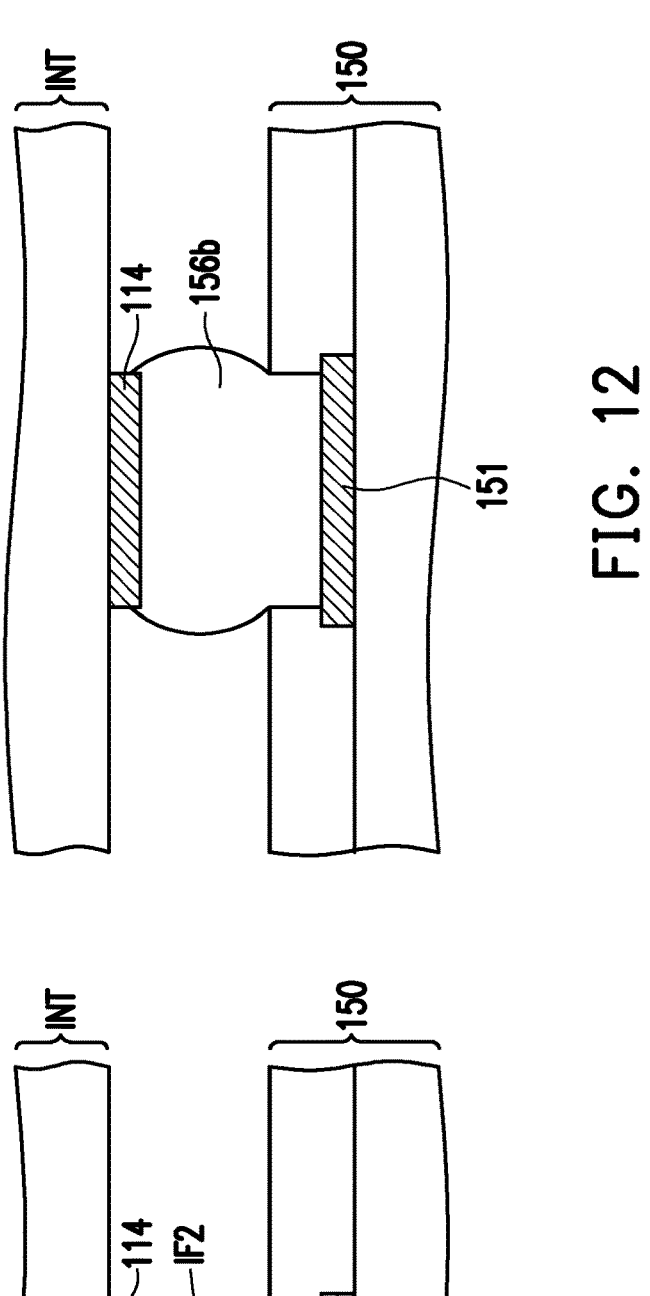
FIG. 11 is a cross-sectional view schematically illustrating the conductive bump 140 and the alloy pattern 154a after performing a pre-heating process in accordance with some other embodiments of the present disclosure.
FIG. 12 is a cross-sectional view schematically illustrating the conductive bump 156b after performing a reflow process in accordance with some other embodiments of the present disclosure.

FIG. 11 is a cross-sectional view schematically illustrating the conductive bump 140 and the alloy pattern 154a after performing a pre-heating process in accordance with some other embodiments of the present disclosure.

Referring to FIG. 11, the conductive bump 140a is formed on the conductive pad 114 distributed on the bottom surface of the interposer substrate INT, the bottom surface of the interposer substrate INT faces the package substrate 150, and the width of the conductive bump 140*a* may be substantially equal to the width of the conductive pad 114. The conductive bump 140*a* includes a single-layered alloy pattern. In the present embodiment, the single-layered alloy pattern of the conductive bump 140*a* includes an alloy pattern comprising Sn and Ag disposed on and physically in contact with the conductive pads 114. The conductive pad 114 may include copper (Cu) pad, and the thickness of the conductive pad 114 may range from about 5 micrometers to about 15 micrometers. The concentration of silver (Ag) contained in the alloy pattern comprising Sn and Ag may range from about 1.0 wt % to about 2.5 wt %, and the thickness of the alloy pattern comprising Sn and Ag may range from about 30 micrometers to about 45 micrometers.

The alloy pattern 154*a* is disposed on and physically in contact with the conductive pad 151 of the package substrate 150. The alloy pattern 154*a* (e.g., pre-solder material) may include a Sn—Bi alloy pattern. The concentration of bismuth (Bi) contained in the Sn—Bi alloy pattern may range from about 40 wt % to about 58 wt %, and the thickness of the Sn—Bi alloy pattern may range from about 35 micrometers to about 45 micrometers. Furthermore, the conductive pad 114, the alloy pattern comprising Sn and Ag 142 and the Sn—Bi alloy pattern 154*a* are substantially identical in width.

During the pre-heating process, the conductive bump 140*a* (i.e., the Sn—Ag alloy pattern) formed on the conductive pads 114 of the interposer substrate INT is vertically aligned with the Sn—Bi alloy pattern 154*a* formed on the conductive pads 151 of the package substrate 150. During the pre-heating process, the alloy pattern comprising Sn and Ag 140*a* is pressed onto the top surface of the Sn—Bi alloy pattern 154*a*. That is, the alloy pattern comprising Sn and Ag 140*a* is physically in contact with the Sn—Bi alloy pattern 154*a*. Then, a low temperature thermal treatment is performed to pre-heat the alloy pattern comprising Sn and Ag 140*a* and the Sn—Bi alloy pattern 154*a* such that the alloy pattern comprising Sn and Ag 140*a* and the Sn—Bi alloy pattern 154*a* are pre-bonded through a pre-bonding interface IF2 generated between the alloy pattern comprising Sn and Ag 140*a* and the Sn—Bi alloy pattern 154*a*. The process temperature of the low temperature thermal treatment may range from about 150 degrees Celsius to about 180 degrees Celsius. The pre-bonding interface IF2 may be an intermetallic compound (IMC) layer containing Sn, Cu and Bi. When performing the low temperature thermal treatment, the alloy pattern comprising Sn and Ag 140*a* and the Sn—Bi alloy pattern 154*a* are heated, the heated alloy pattern comprising Sn and Ag 140*a* and the heated Sn—Bi alloy pattern 154*a* remain solid state, and less deformation occurs between the interposer substrate INT and the package substrate 150.

In some alternative embodiments, the single-layered alloy pattern of the conductive bump 140*a* includes an alloy pattern comprising Sn and Ag disposed on and physically in contact with the conductive pads 114. The conductive pad 114 may include copper (Cu) pad, and the thickness of the conductive pad 114 may range from about 5 micrometers to about 15 micrometers. The concentration of silver (Ag) contained in the alloy pattern comprising Sn and Ag 140*a* may range from about 1 wt % to about 2.5 wt %, and the thickness of the alloy pattern comprising Sn and Ag 140*a* may range from about 20 micrometers to about 25 micrometers. Furthermore, the conductive pad 114 and the conductive bumps 140*a* are substantially identical in width. The alloy pattern 154*a* is disposed on and physically in contact with the conductive pad 151 of the package substrate 150. The alloy pattern 154*a* (e.g., pre-solder material) may include a Sn—In alloy pattern. The concentration of indium (In) contained in the Sn—In alloy pattern 144 may range from about 15 wt % to about 25 wt %, and the thickness of the Sn—In alloy pattern 144 may range from about 10 micrometers to about 15 micrometers.

During the pre-heating process, the conductive bump 140*a* formed on the conductive pads 114 of the interposer substrate INT is vertically aligned with the Sn—In alloy pattern 154*a* formed on the conductive pads 151 of the package substrate 150. During the pre-heating process, the conductive bump 140*a* is pressed onto the top surface of the Sn—In alloy pattern 154*a*. That is, the conductive bump 140*a* is physically in contact with the Sn—In alloy pattern 154*a*. Then, a low temperature thermal treatment is performed to pre-heat the conductive bump 140*a* and the Sn—In alloy pattern 154*a* such that the conductive bump 140*a* and the Sn—In alloy pattern 154*a* are pre-bonded through a pre-bonding interface IF2 generated between the conductive bump 140*a* and the Sn—In alloy pattern 154*a*. The process temperature of the low temperature thermal treatment may range from about 150 degrees Celsius to about 180 degrees Celsius. The pre-bonding interface IF2 may be an intermetallic compound (IMC) layer containing Sn, Cu and In. When performing the low temperature thermal treatment, the conductive bump 140*a* and the alloy pattern 154*a* in contact with the conductive bump 140*a* are heated, the heated conductive bump 140 and the heated alloy pattern 154 remain solid state, and less deformation occurs between the interposer substrate INT and the package substrate 150.

In some embodiments, the alloy pattern comprising Sn and Ag 142, the Sn—Bi or Sn—In alloy pattern 154*a* are solid state during the pre-heating process.

FIG. 12 is a cross-sectional view schematically illustrating the conductive bump 156*b* after performing a reflow process in accordance with some other embodiments of the present disclosure.

Referring to FIG. 12, after performing the pre-heating process, a high temperature thermal treatment (i.e., a reflow process) is performed to heat the conductive bump 140*a* and the alloy pattern 154*a*. The high temperature thermal treatment (i.e., a reflow process) may be performed under a higher process temperature ranging from about 230 degrees Celsius to about 250 degrees Celsius. After performing the above-mentioned reflow process, mutual fusion of the conductive bump 140*a* and the alloy pattern 154*a* forms the conductive bump 156*b* between the conductive pad 114 and the conductive pad 151. After performing the reflow process, the interposer substrate INT is electrically connected to the package substrate 150 through the conductive bumps 156*b*. In some embodiments where the conductive bump 140 is the alloy pattern comprising Sn and Ag and the alloy pattern 154*a* is a Sn—Bi alloy pattern, the material of the conductive bump 156*b* includes a bismuth (Bi) containing alloy containing alloy. The bismuth (Bi) containing alloy may be Sn—Ag—Cu—Bi alloy. For example, the concentration of bismuth (Bi) contained in the Sn—Ag—Cu—Bi alloy ranges from about 1 wt % to about 10 wt %. In some embodiments, the concentration of bismuth (Bi) contained in the Sn—Ag—Cu—Bi alloy is less than about 6 wt %.

In some alternative embodiments where the single layered pattern of the conductive bump 140 is an alloy pattern comprising Sn and Ag 142 and the alloy pattern 154*a* is a Sn—In alloy pattern, the material of the conductive bumps 156b includes an indium (In) containing alloy. The indium (In) containing alloy may be Sn—Ag—Cu—In alloy. For example, the concentration of indium (In) contained in the Sn—Ag—Cu—In alloy ranges from about 1 wt % to about 10 wt %. The concentration of indium (In) contained in the Sn—Ag—Cu—In alloy may be less than about 6 wt %.

The above-mentioned Sn—Ag—Cu—In or Sn—Ag—Cu—In alloy bump 156a (illustrated in FIG. 10) and 156b (illustrated in FIG. 12) are described are utilized in the CoWoS package structure P1 (illustrated in FIG. 8). However, the Sn—Ag—Cu—In or Sn—Ag—Cu—In alloy bump may be utilized in other types of package structures, such as an integrated fan-out on substrate (InFO_oS) package structure, an integrated fan-out package structure having local silicon interconnect (InFO_LSI) or a flip-chip type ball grid array (F/C BGA) package structure. Details of the InFO_oS package structure, the InFO_LSI package structure and the F/C BGA package structure are described in accompany with FIGS. 13 through 15.

In some embodiments, the Sn—Bi or Si—In alloy pattern 154a is solid state, and the alloy pattern comprising Sn and Ag 140a is liquid state when performing the reflow process. In some embodiments, the Sn—Bi or Si—In alloy pattern 154a is liquid state, and the alloy pattern comprising Sn and Ag 140a is liquid state when performing the reflow process. In some embodiments, the Sn—Bi or Si—In alloy pattern 154a is solid state, and the alloy pattern comprising Sn and Ag 140a is solid state when performing the reflow process.

Figure 13:
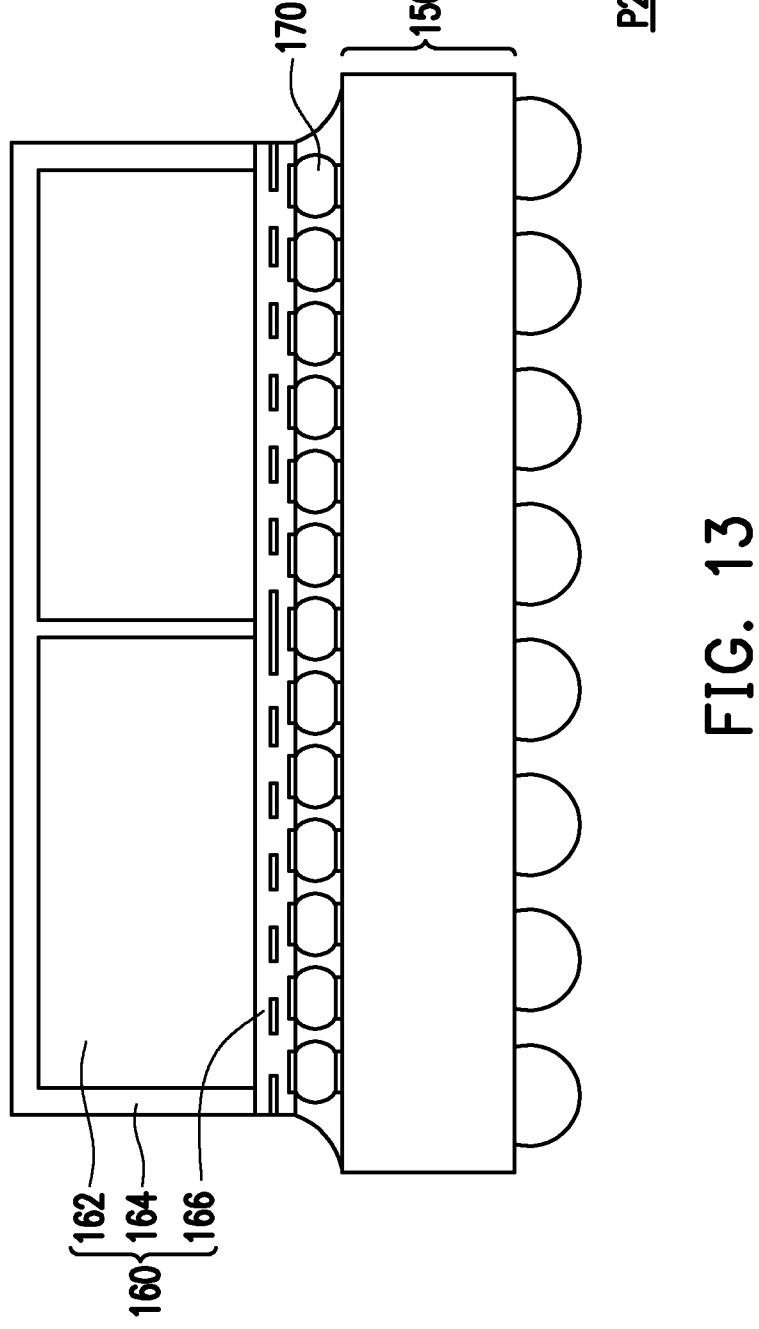
FIG. 13 is a cross-sectional view schematically illustrating an integrated fan-out on substrate (InFO_oS) package structure in accordance with some other embodiments of the present disclosure.

FIG. 13 is a cross-sectional view schematically illustrating an integrated fan-out on substrate (InFO_oS) package structure in accordance with some other embodiments of the present disclosure.

Referring to FIG. 13, the above-mentioned Sn—Ag—Cu—In or Sn—Ag—Cu—In alloy bumps may be utilized in the InFO_oS package structure P2. The InFO_oS package structure P2 includes a package substrate 150, an integrated fan-out package 160 and conductive bumps 170, wherein the integrated fan-out package 160 is disposed on and electrically connected to the package substrate 150 through the conductive bumps 170. The conductive bumps 170 include above-mentioned Sn—Ag—Cu—In or Sn—Ag—Cu—In alloy bumps. The integrated fan-out package 160 includes at least one semiconductor die 162, an insulating encapsulant 164 laterally encapsulating the at least one semiconductor die 162, and a redistribution circuit structure 166 disposed on the at least one semiconductor die 162 and the insulating encapsulant 164. The conductive bumps 170 are disposed between conductive pads of the redistribution circuit structure 166 and conductive pads of the package substrate 150.

Figure 14:
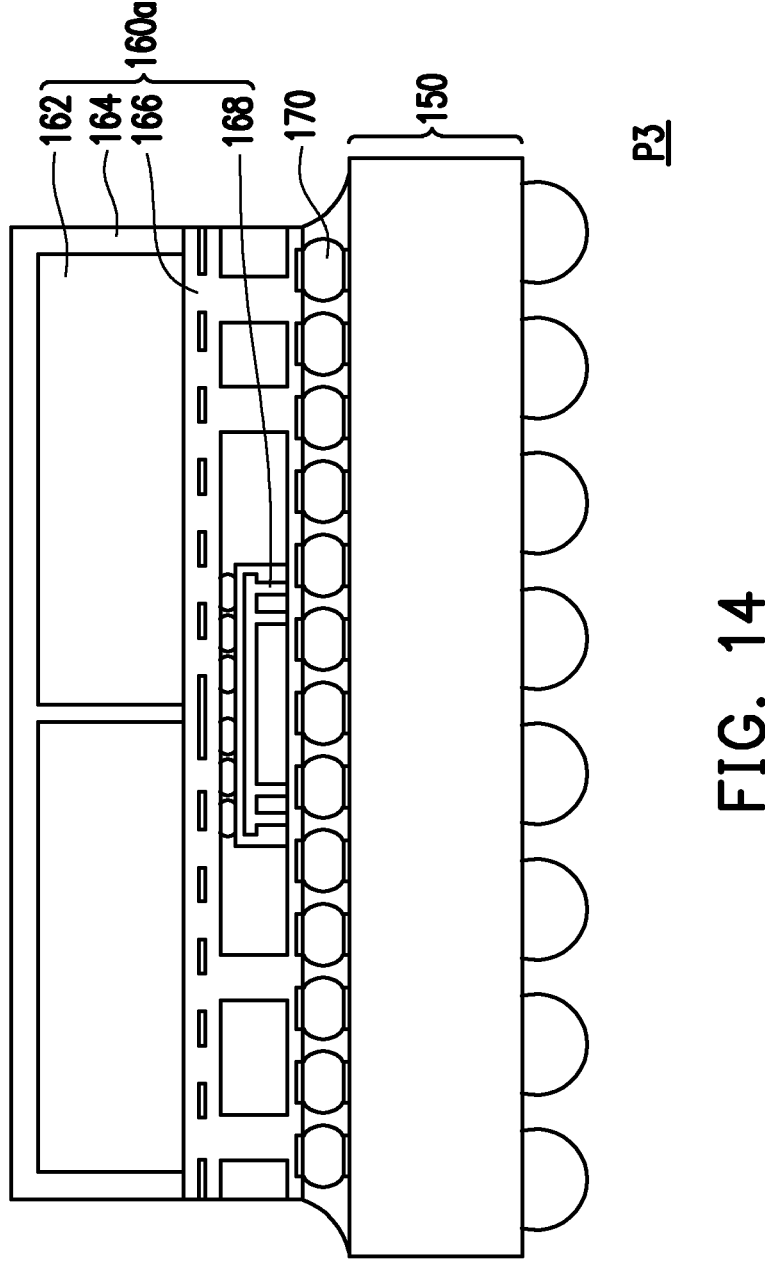
FIG. 14 is a cross-sectional view schematically illustrating an integrated fan-out package structure having local silicon interconnect (InFO_LSI) in accordance with some other embodiments of the present disclosure.

FIG. 14 is a cross-sectional view schematically illustrating an integrated fan-out package structure having local silicon interconnect (InFO_LSI) in accordance with some other embodiments of the present disclosure.

Referring to FIG. 14, the above-mentioned Sn—Ag—Cu—In or Sn—Ag—Cu—In alloy bumps may be utilized in the InFO_LSI package structure P3. The InFO_LSI package structure P3 includes a package substrate 150, an integrated fan-out package 160a and conductive bumps 170, wherein the integrated fan-out package 160a is disposed on and electrically connected to the package substrate 150 through the conductive bumps 170. The conductive bumps 170 include above-mentioned Sn—Ag—Cu—In or Sn—Ag—Cu—In alloy bumps. The integrated fan-out package 160a includes at least one semiconductor die 162, an insulating encapsulant 164 laterally encapsulating the at least one semiconductor die 162, a redistribution circuit structure 166 disposed on the at least one semiconductor die 162 and the insulating encapsulant 164, and a local interconnect device 168 embedded in and electrically connected to the redistribution circuit structure 166. A portion of the conductive bumps 170 are disposed between conductive pads of the redistribution circuit structure 166 and conductive pads of the package substrate 150, and the rest of the conductive bumps 170 are disposed between conductive pads of the local interconnect device 168 and conductive pads of the package substrate 150.

Figure 15:
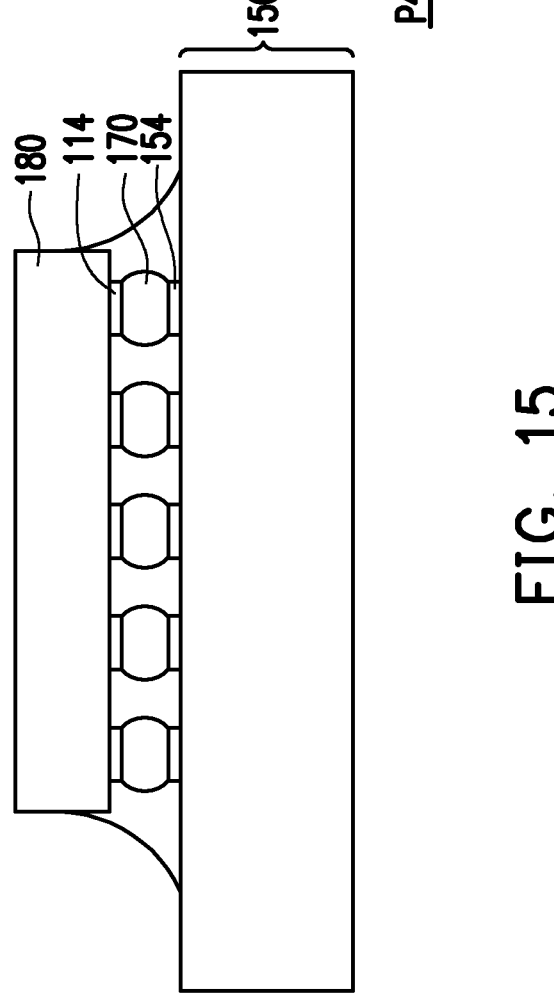
FIG. 15 is a cross-sectional view schematically illustrating a flip-chip type ball grid array (F/C BGA) package structure in accordance with some other embodiments of the present disclosure.

FIG. 15 is a cross-sectional view schematically illustrating a flip-chip type ball grid array (F/C BGA) package structure in accordance with some other embodiments of the present disclosure.

Referring to FIG. 15, the above-mentioned Sn—Ag—Cu—In or Sn—Ag—Cu—In alloy bumps may be utilized in a F/C BGA package structure P4. The F/C BGA package structure P4 includes a package substrate 150 and a semiconductor die 180 disposed on and electrically connected to the package substrate 150 through the conductive bumps 170, wherein the conductive bumps 170 are disposed on the active surface 182 of the semiconductor die 180, and the conductive bumps 170 are disposed between the active surface 182 of the semiconductor die 180 and the package substrate 150. The conductive bumps 170 are disposed between conductive pads distributed on the active surface 182 of the semiconductor die 180 and conductive pads of the package substrate 150.

In accordance with some embodiments of the disclosure, a method for forming conductive bumps is provided. The method for forming the conductive bumps includes followings. A package substrate including first conductive pads is provided. alloy patterns comprising Sn and Cu are formed on the first conductive pads respectively. A structure including second conductive pads is provided. alloy patterns comprising Sn and Ag are formed on the second conductive pads respectively. Alloy patterns comprising Sn and X are formed on the alloy patterns comprising Sn and Ag, wherein X represents bismuth or indium. The alloy patterns comprising Sn and X and the alloy patterns comprising Sn and Cu are bonded under a first temperature. A reflow process is performed under a second temperature to form the conductive bumps between the first conductive pads and the second conductive pads, wherein the second temperature is higher than the first temperature. In some embodiments, the alloy patterns comprising Sn and Ag, the alloy patterns comprising Sn and X, and the alloy patterns comprising Sn and Cu are solid state when bonding the alloy patterns comprising Sn and X and the alloy patterns comprising Sn and Cu. In some embodiments, the alloy patterns comprising Sn and Cu are liquid state, the alloy patterns comprising Sn and X are solid state, and the alloy patterns comprising Sn and Ag are solid state when performing the reflow process. In some embodiments, the alloy patterns comprising Sn and Cu, the alloy patterns comprising Sn and X, and the alloy patterns comprising Sn and Ag are solid state when performing the reflow process. In some embodiments, the alloy patterns comprising Sn and Cu, the alloy patterns comprising Sn and X, and the alloy patterns comprising Sn and Ag are liquid state when performing the reflow process. In some embodiments, the material of the conductive bumps comprises Sn—Ag—Cu—X alloy, and the concentration of X contained in the Sn—Ag—Cu—X alloy ranges from about 1 wt % to about 10 wt %.

In accordance with some other embodiments of the disclosure, a method for forming conductive bumps is provided. The method for forming the conductive bumps includes followings. A package substrate including first conductive pads is provided. Alloy patterns comprising Sn and X are formed on the first conductive pads respectively, wherein X represents bismuth or indium. A structure including second conductive pads is provided. alloy patterns comprising Sn and Ag are formed on the second conductive pads respectively. The alloy patterns comprising Sn and X and the alloy patterns comprising Sn and Ag are bonded under a first temperature. A reflow process is performed under a second temperature to form the conductive bumps between the first conductive pads and the second conductive pads, wherein the second temperature is higher than the first temperature. In some embodiments, the alloy patterns comprising Sn and Ag and the alloy patterns comprising Sn and X are solid state when bonding the alloy patterns comprising Sn and X and the alloy patterns comprising Sn and Ag. In some embodiments, the alloy patterns comprising Sn and X are solid state, and the alloy patterns comprising Sn and Ag are liquid state when performing the reflow process. In some embodiments, the alloy patterns comprising Sn and X are liquid state, and the alloy patterns comprising Sn and Ag are liquid state when performing the reflow process. In some embodiments, the alloy patterns comprising Sn and X are solid state, and the alloy patterns comprising Sn and Ag are solid state when performing the reflow process.

In accordance with some other embodiments of the disclosure, an electronic apparatus including a package substrate and a structure disposed on and electrically connected to the package substrate through conductive bumps is provided. The material of the conductive bumps includes a bismuth (Bi) containing alloy or an indium (In) containing alloy. In some embodiments, the bismuth (Bi) containing alloy includes Sn—Ag—Cu—Bi alloy. In some embodiments, a concentration of bismuth (Bi) contained in the Sn—Ag—Cu—Bi alloy ranges from about 1 wt % to about 10 wt %. In some embodiments, the indium (In) containing alloy includes Sn—Ag—Cu—In alloy. In some embodiments, the concentration of indium (In) contained in the Sn—Ag—Cu—In alloy ranges from about 1 wt % to about 10 wt %. In some embodiments, the structure comprises a semiconductor die, and the conductive bumps are disposed on an active surface of the semiconductor die. In some embodiments, the structure comprises an integrated fan-out package, and the integrated fan-out package includes at least one semiconductor die, an insulating encapsulant laterally encapsulating the at least one semiconductor die, and a redistribution circuit structure disposed on the at least one semiconductor die and the insulating encapsulant. In some embodiments, the structure comprises an integrated fan-out package, and the integrated fan-out package includes at least one semiconductor die, an insulating encapsulant laterally encapsulating the at least one semiconductor die, a redistribution circuit structure disposed on the at least one semiconductor die and the insulating encapsulant, and a local interconnect device embedded in and electrically connected to the redistribution circuit structure. In some embodiments, the structure includes an interposer substrate, at least one semiconductor chip disposed on and electrically connected to the interposer substrate, and an insulating encapsulant disposed on the interposer substrate and laterally encapsulating the at least one semiconductor chip, wherein the conductive bumps are disposed on a surface of the interposer substrate and electrically connected to the interposer substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a package substrate comprising first conductive pads;
   forming alloy patterns comprising Sn and Cu on the first conductive pads respectively;
   providing a structure comprising second conductive pads;
   forming alloy patterns comprising Sn and Ag on the second conductive pads respectively;
   forming alloy patterns comprising Sn and X on the alloy patterns comprising Sn and Ag, wherein X represents bismuth or indium;
   bonding the alloy patterns comprising Sn and X and the alloy patterns comprising Sn and Cu under a first temperature, wherein the alloy patterns comprising Sn and Ag, the alloy patterns comprising Sn and X and the alloy patterns comprising Sn and Cu remain solid state during bonding the alloy patterns comprising Sn and X and the alloy patterns comprising Sn and Cu; and
   performing a reflow process under a second temperature to form conductive bumps between the first conductive pads and the second conductive pads, wherein the second temperature is higher than the first temperature.

2. The method as claimed in claim 1, wherein during bonding the alloy patterns comprising Sn and X and the alloy patterns comprising Sn and Cu, an intermetallic compound (IMC) layer is generated between the alloy patterns comprising Sn and X and the alloy patterns comprising Sn and Cu.

3. The method as claimed in claim 1, wherein the alloy patterns comprising Sn and Cu are liquid state, the alloy patterns comprising Sn and X are solid state, and the alloy patterns comprising Sn and Ag are solid state when performing the reflow process.

4. The method as claimed in claim 1, wherein the alloy patterns comprising Sn and Cu, the alloy patterns comprising Sn and X and the alloy patterns comprising Sn and Ag are solid state when performing the reflow process.

5. The method as claimed in claim 1, wherein the alloy patterns comprising Sn and Cu, the alloy patterns comprising Sn and X and the alloy patterns comprising Sn and Ag are liquid state when performing the reflow process.

6. The method as claimed in claim 1, wherein a material of the conductive bumps comprises Sn—Ag—Cu—X alloy, and a concentration of X contained in the Sn—Ag—Cu—X alloy ranges from about 1 wt % to about 10 wt %.

7. A method, comprising:
   providing a package substrate comprising first conductive pads;
   forming alloy patterns comprising Sn and X on the first conductive pads respectively, wherein X represents bismuth or indium;
   providing a structure comprising second conductive pads;
   forming alloy patterns comprising Sn and Ag on the second conductive pads respectively;
   bonding the alloy patterns comprising Sn and X and the alloy patterns comprising Sn and Ag under a first temperature, wherein the alloy patterns comprising Sn and X and the alloy patterns comprising Sn and Ag remain solid state during bonding the alloy patterns comprising Sn and X and the alloy patterns comprising Sn and Ag; and performing a reflow process under a second temperature to form conductive bumps between the first conductive pads and the second conductive pads, wherein the second temperature is higher than the first temperature.

8. The method as claimed in claim 7, wherein during bonding the alloy patterns comprising Sn and X and the alloy patterns comprising Sn and Ag, an intermetallic compound (IMC) layer is generated between the alloy patterns comprising Sn and X and the alloy patterns comprising Sn and Ag.

9. The method as claimed in claim 7, wherein the alloy patterns comprising Sn and X are solid state, and the alloy patterns comprising Sn and Ag are liquid state when performing the reflow process.

10. The method as claimed in claim 7, wherein the alloy patterns comprising Sn and X are liquid state, and the alloy patterns comprising Sn and Ag are liquid state when performing the reflow process.

11. The method as claimed in claim 7, wherein the alloy patterns comprising Sn and X are solid state, and the alloy patterns comprising Sn and Ag are solid state when performing the reflow process.

12. A method, comprising:

forming Sn—Cu alloy patterns on first conductive pads of a first structure;

forming Sn—Ag alloy patterns on second conductive pads of a second structure;

forming Sn—X alloy patterns on the Sn—Ag alloy patterns, wherein X represents bismuth or indium;

pre-heating the Sn—X alloy patterns and the Sn—Cu alloy patterns under a first temperature, wherein the Sn—X alloy patterns remain solid state during pre-heating the Sn—X alloy patterns and the Sn—Cu alloy patterns; and performing a reflow process under a second temperature to form conductive bumps between the first conductive pads and the second conductive pads, wherein the second temperature is higher than the first temperature.

13. The method as claimed in claim 12, wherein the Sn—Ag alloy patterns, the Sn—X alloy patterns and the Sn—Cu alloy patterns remain solid state during pre-heating the Sn—X alloy patterns and the Sn—Cu alloy patterns.

14. The method as claimed in claim 12, wherein the Sn—Cu alloy patterns are liquid state, the Sn—X alloy patterns are solid state, and the Sn—Ag alloy patterns are solid state when performing the reflow process.

15. The method as claimed in claim 12, wherein the Sn—Cu alloy patterns, the Sn—X alloy patterns and the Sn—Ag alloy patterns are solid state when performing the reflow process.

16. The method as claimed in claim 12, wherein the Sn—Cu alloy patterns, the Sn—X alloy patterns and the Sn—Ag alloy patterns are liquid state when performing the reflow process.

17. The method as claimed in claim 12, wherein a material of the conductive bumps comprises Sn—Ag—Cu—X alloy, and a concentration of X contained in the Sn—Ag—Cu—X alloy ranges from about 1 wt % to about 10 wt %.

18. The method as claimed in claim 12, wherein a concentration of silver (Ag) contained in the Sn—Ag alloy patterns ranges from about 1.0 wt % to about 2.5 wt %, and a thickness of the Sn—Ag alloy pattern ranges from about 20 micrometers to about 25 micrometers.

19. The method as claimed in claim 12, wherein a concentration of bismuth (Bi) contained in the Sn—Bi alloy patterns ranges from about 40 wt % to about 58 wt %, and a thickness of the Sn—Bi alloy patterns ranges from about 10 micrometers to about 15 micrometers.

20. The method as claimed in claim 12, wherein a concentration of copper (Cu) contained in the Sn—Cu alloy patterns ranges from about 0.4 wt % to about 1.1 wt %, and a thickness of the Sn—Cu alloy patterns ranges from about 35 micrometers to about 45 micrometers.

\* \* \* \* \*